United States Patent
Strutner et al.

(10) Patent No.: US 11,353,524 B1
(45) Date of Patent: Jun. 7, 2022

(54) OPTICAL FIBER-BASED DISTRIBUTED SENSING OF MAGNETIC FIELD GRADIENTS

(71) Applicant: United States of America as Represented by the Administrator of NASA, Washington, DC (US)

(72) Inventors: Scott Michael Strutner, Los Angeles, CA (US); Anthony Barra, Corona del Mar, CA (US); Gregory Paul Carman, Los Angeles, CA (US); William Lance Richards, Lancaster, CA (US); Francisco Peña, Pasadena, CA (US)

(73) Assignee: U.S.A, as Represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 16/933,572

(22) Filed: Jul. 20, 2020

Related U.S. Application Data

(60) Provisional application No. 62/875,558, filed on Jul. 18, 2019.

(51) Int. Cl.
*G01R 33/032* (2006.01)

(52) U.S. Cl.
CPC ............................. *G01R 33/0327* (2013.01)

(58) Field of Classification Search
CPC .................................................. G01R 33/0327
USPC ....................................................... 324/244.1
See application file for complete search history.

(56) References Cited

U.S. PATENT DOCUMENTS

| 4,600,885 A | 7/1986 | Koo et al. |
| 5,680,489 A | 10/1997 | Kersey |
| 7,195,033 B2 | 3/2007 | Mayeu et al. |
| 9,274,181 B1 | 3/2016 | Carman et al. |
| 9,823,277 B1 * | 11/2017 | Lagakos ............ G01R 33/0327 |

OTHER PUBLICATIONS

Pacheco, Clara J., and Antonio C. Bruno. "A noncontact force sensor based on a fiber Bragg grating and its application for corrosion measurement." Sensors 13.9 (2013): 11476-11489. (Year: 2013).*

(Continued)

*Primary Examiner* — Christopher P McAndrew

(57) ABSTRACT

A system for measuring magnetic field gradients comprising a multi-bay support structure with a series of raised contact shoulders separated from each other by voids. An optical fiber is spaced along the length of the multi-cell support structure and traverses all the raised contact points and voids. The optical fiber has a plurality of Fiber Bragg gratings (FBGs) spaced lengthwise, each FBG suspended in a void. In addition, a plurality of ferromagnetic members are strung onto the optical fiber, each suspended in a void. Magnetic field gradients act on the ferromagnetic member to create localized tension in the optical fiber. The FBG's refractive indices are monitored, tension is calculated therefrom, and the tension is correlated to the magnetic field gradient. This greatly simplifies mechanical, optical, electronic and computational complexity and is bay suited for any FOSS array for measuring magnetic fields using many dense measurement points.

32 Claims, 7 Drawing Sheets

(56) References Cited

OTHER PUBLICATIONS

Pacheco, Clara J., and Antonio C. Bruno. "A noncontact force sensor based on a fiber Bragg grating and its application for corrosion measurement." Sensors 13.9 (2013): 11476-11489. (Year: 2013) (Year: 2013).*

* cited by examiner

OPTICAL FIBER-BASED DISTRIBUTED SENSING OF MAGNETIC FIELD GRADIENTS

CROSS-REFERENCE TO RELATED APPLICATIONS

The present application derives priority from U.S. provisional patent application Ser. No. 62/875,558 filed on 19 Jul. 2019.

STATEMENT OF GOVERNMENT RIGHTS

This invention was made with government support under funding project awarded by the United States. The government has certain rights in the invention.

BACKGROUND OF THE INVENTION

1. Field of the Invention

The present invention relates to optical fiber sensing systems and, more specifically, to a method and system for measuring magnetic field gradients at regular intervals along an optical fiber.

2. Description of the Background

A magnetometer is a known device that measures magnetism, e.g., direction, strength, or relative change of a magnetic field. There are numerous industrial and engineering applications that require magnetometers. For example, magnetic field exposure can harm a spacecraft and so magnetic field exposure should be monitored so that mitigation and maintenance can be prescribed if there is overexposure. Oil pipeline inspection monitors magnetic flux leakage along the walls of pipes to identify wall thinning due to corrosion, abrasion, pin-holes or cracking. Shipping containers may also be monitored to prevent magnetic field exposure to sensitive equipment contained therein. There are many different types of sensors and sensing networks for accomplishing the foregoing. However, existing magnetometer arrays used for such activities are cumbersome in size when hundreds of sensors are desired.

One conventional type of fiber optic sensor is known as the Fiber Bragg Grating (FBG or "Bragg grating"). When incorporated into an optical fiber, an FBG reflects particular wavelengths of light based on its Bragg wavelength, an inherent characteristic of the FBG for a given mode. Strain acting on the fiber and thus on the FBG will alter the reflected wavelength. The characteristics of the reflected light can thus be analyzed to determine the strain characteristics of the fiber, with data points corresponding to the discrete locations of the Bragg gratings.

Optical fiber sensors are typically composed of numerous optical fibers and numerous Fiber Bragg gratings (FBGs) periodically-spaced along the length of each fiber. Each FBG creates its periodic variation of the optical refractive index in the core of its associated optical fiber, and when coupled to an interferometer it is possible to detect strain individually through change in its resonant wavelength (i.e., the wavelength at which each grating has its maximum reflectance).

Previous efforts to implement a fiber-optic magnetometer rely on magnetostrictive fiber coatings that detect changes in magnetic fields, or embed the fiber in magnetostrictive substrate. For example, U.S. Pat. No. 9,274,181 to Carman et al. issued Mar. 1, 2016 shows cladding of the optical fiber using ferromagnetic particles. When a magnetic field is present, the ferromagnetic particles change the optical properties of the sensor directly. Similarly, U.S. Pat. No. 4,600,885 to Koo et al. issued Jul. 15, 1986 show a fiber optic magnetometer for detecting DC magnetic fields using a magnetostrictive jacket on the fiber. U.S. Pat. No. 5,680,489 to Kersey issued 1 Oct. 1997 sandwiches an optical fiber between two plates of a magnetic material. U.S. Pat. No. 7,195,033 to Mayeu et al. issued Mar. 27, 2007 use a magnetostrictive material to compress or pinch the fiber in response to applied magnetic field. Unfortunately, embedding or coating the fiber detracts from sensitivity and signal resolution, and makes compact sensor density impractical. In addition, attaching magnetostrictive materials to an FBG generally makes for a hysteretic, thermally sensitive sensor which must be overcome with additional algorithms.

What is needed is a method and system for measuring magnetic field "gradients" (any increase or decrease in magnitude) at regular intervals along an optical fiber that offers greater sensitivity, compactness, and signal resolution, without attaching magnetostrictive materials to the FBG.

SUMMARY OF THE INVENTION

It is, therefore, an object of the present invention to provide a method and system for measuring a magnetic field gradient using a magnetic member suspended in a void to strain an optical fiber, whereby when the magnetic member encounters a magnetic field gradient that induces forces producing displacement of the magnetic member which is then measurable as strain in the optical fiber.

It is another object to provide a magnetometer array that incorporates large number of MFBG sensors in a lightweight, dense-array, system.

It is still another object to provide a dense magnetometer array as above with greater sensitivity and signal resolution that does not rely on attaching magneto-strictive materials to the optical fiber.

According to the present invention, the above-described and other objects are accomplished with an apparatus for measuring magnetic field gradients comprising a multi-bay support structure comprising a series of raised contact shoulders separated from each other by voids. An optical fiber is spaced along the length of the multi-bay support structure and traverses all of the raised contact points and voids. The optical fiber has a plurality of Fiber Bragg gratings (FBGs) spaced along the length of the optical fiber, each FBG being suspended in one of the voids. In addition, a plurality of ferromagnetic members are strung onto the optical fiber, each suspended in one of the voids. In use, a magnetic field gradient about the optical fiber and ferromagnetic members creates localized 2D or 3D tension in the optical fiber at each FBG. The refractive index of the FBGs are monitored, tension is calculated therefrom, and the tension is correlated to the magnetic field gradient.

The magnetometer device for measuring magnetic field gradients and technique disclosed herein greatly simplifies mechanical, optical, electronic and computational complexity, and is especially suited for use in any multiplexed or branched fiber optic sensing system (FOSS) network for measuring magnetic fields using a lot of dense measurement points.

BRIEF DESCRIPTION OF THE DRAWINGS

Other objects, features, and advantages of the present invention will become more apparent from the following detailed description of the preferred embodiments and certain modifications thereof when taken together with the accompanying drawings in which.

DETAILED DESCRIPTION OF THE PREFERRED EMBODIMENT

The present invention is a method and system for measuring magnetic field gradients at regular intervals along an optical fiber.

Figure 1:
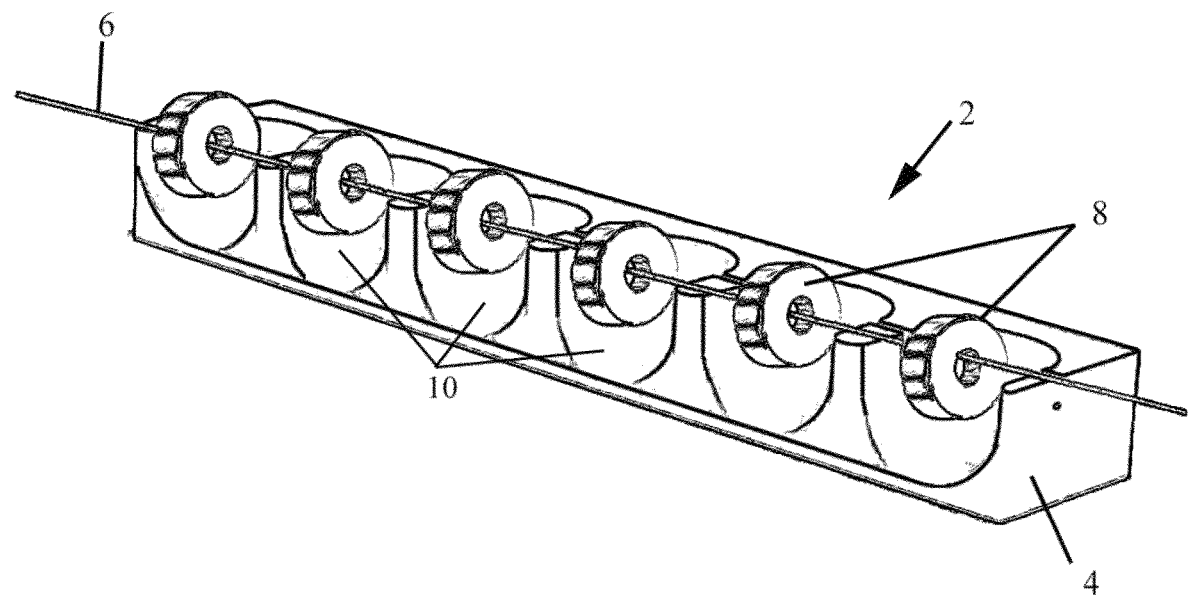
FIG. 1 is a perspective view of an exemplary magnetic fiber Bragg grating (MFBG) device 2 according to an embodiment of the invention.
Figure 2:
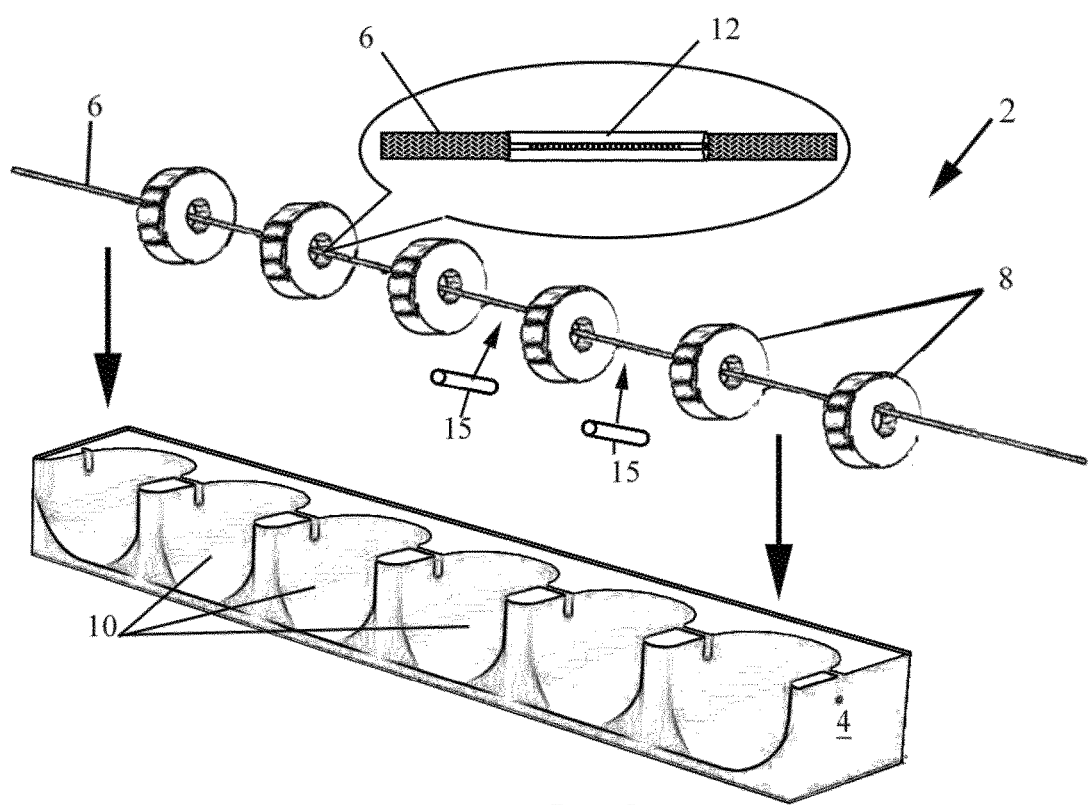
FIG. 2 is an exploded assembly drawing of the MFBG device 2 of FIG. 1.

FIG. 1 is a perspective view of an exemplary magnetic fiber Bragg grating (MFBG) device 2 according to an embodiment of the invention, and FIG. 2 is an exploded assembly drawing. The MFBG device 2 generally comprises a support structure 4 suspending an optical fiber 6 having one or more fiber Bragg gratings (FBGs) 12 spaced along its length, and a corresponding number of magnetic members 8 strung onto or otherwise attached to the optical fiber 6 at positions corresponding to the FBGs 12. One skilled in the art should understand that optical fiber 6 may have multiple discrete FBGs 12 spaced along its length or a single continuous FBG 12 running along its entire length. Magnetic members 8 are preferably made of ferromagnetic material, but may alternately be ferrimagnetric or other suitable magnetic material. The embodiment of FIG. 1 is a multi-sensor embodiment by which support structure 4 is a monolithic member formed with a plurality of bays 10. The bays 10 each define a void between two opposing elevated support shoulders, and the support shoulders provide contact points to seat and secure the optical fiber 6. The optical fiber 6 is suspended between the pair of raised contact points of the support shoulders, and within each void 10 both an FBG 12 and ferromagnetic member 8 are carried on the optical fiber 6 and suspended in the void. Optionally, short segments of straw-like spacers 15 may be inserted onto the optical fiber 6 on opposing sides of each ferromagnetic member 8 to maintain it centered within the bay 10. In the multi-cell embodiment a single optical fiber 6 traverses all of the bays 10, and a permanent magnet 8 is suspended centrally in each bay 10. The partitioned bays 10 isolate induced tension and strain in fiber 6 to only a region at a time and thus allow the fiber 6 to act as a series of MFBGs.

A suitable multi-bay support structure 4 may be made of printed or molded ABS plastic, and bays 10 are preferably spaced with a 2 cm pitch. The ferromagnetic members 8 preferably comprises magnetic beads 8 of any suitable ferromagnetic material such as Iron, Cobalt, Nickel, metallic alloys and rare earth magnets. The ferromagnetic members 8 are most preferably shaped as toroids. In an embodiment, ferrite choke toroids with a permeability of 550 were used, each having dimensions 3.18 mm thick, an outer diameter of 9.65 mm and inner diameter of 4.78 mm. Each had a mass of 1.5 g and volume of 164 mm³. Alternatively, neodymium-iron-boron magnetic beads 8 may be used, grade N42, and dimensions of 1.5875 mm thick, an outer diameter of 6.35 mm and inner diameter of 1.5875 mm. The optical fiber 6 may be seated in grooves atop each of the flanking shoulders and may be optionally attached to the support structure 4 with cyanoacrylate-based glue (the fiber 6 is glued to the supporting structure 6 each time it crosses it).

Figure 3:
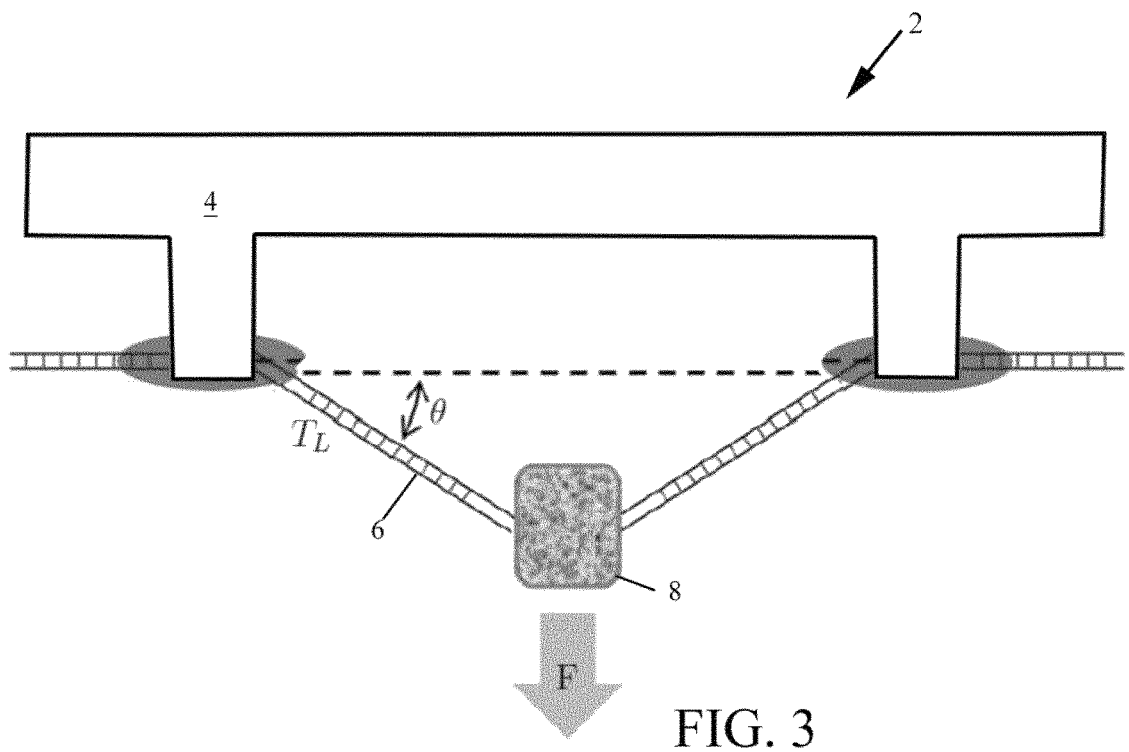
FIG. 3 is a diagrammatic view illustrating the operation of one of the MFBGs 2 of FIGS. 1-2.

FIG. 3 is a diagrammatic view illustrating the operation of one of the MFBGs 2 of FIGS. 1-2. A plurality of such magnets 8 may be strung or otherwise attached along the fiber 6 like pearls on a necklace, and then the fiber 6 selectively mounted to the contact points of the support structure 4 to isolate induced tension and strain to only one bay 10 at a time. An FBG 12 is formed along the fiber 6 such as by variation of refractive index in the core of the optical fiber 6, the FBG 12 likewise between the contact points of the support structure 4 to sense induced tension and strain in that section of fiber 6. It should be apparent that extending this configuration using the multi-bay support structure 4 of FIG. 1-2 thus allows the fiber 6 to serve a series of FBGs 12 (in this case obscured under ferromagnetic member 8), each cell effectively forming a magnetic fiber Bragg grating (MFBGs). The ferromagnetic member 8 in this case is magnetized perpendicular to the optical fiber 6 on which it is strung. As ferromagnetic member 8 encounters a magnetic field gradient, such as due to nearby iron that it has magnetized with its own magnetic field, then the ferromagnetic member 8 is attracted with a force 'F.' This induces a tension in the optical fiber 6 which can be solved for as:

$$T = F/(2 \sin \theta) \quad [1]$$

Thus, while the angles θ is less than 30° then the suspended magnet 8 will offer a mechanical advantage to the sensing of applied forces. To solve for θ, use the triangle made by the original length from the edge of the magnet 8 to the edge of the support structure 4 which strains by ε as it is forced down.

$$\cos(\theta) = l/(1+\varepsilon) = (1+\varepsilon)^{-1} \quad [2]$$

$$\theta = \cos^{-1}((1+\varepsilon)^{-1}) \quad [3]$$

Substituting equation [3] into Equation [1] and solving for T, $$F = 2T \sin(\cos^{-1}((1+\varepsilon)^{-1})) \quad [4]$$

This can be simplified to $$F = 2T\sqrt{1-(1+\varepsilon)^{-2}} \quad [5]$$

Now tension T can be solved for as a strain on the spring nature k of the fiber 6.

$$T = k\varepsilon \quad [6]$$

with k as a stiffness of the optical fiber, which can be measured but should equal $$k=AE \quad [7]$$

where A is the cross sectional area, and E is the Young's modulus. Typical optical fibers may yield when loaded with 49 N at 5% strain and 50 nm of $\Delta\lambda_B$, so the fiber has a k of roughly 1000 N.

$$F=2k\varepsilon\sqrt{1-(1+\varepsilon)^{-2}} \quad [8]$$

Figure 4:
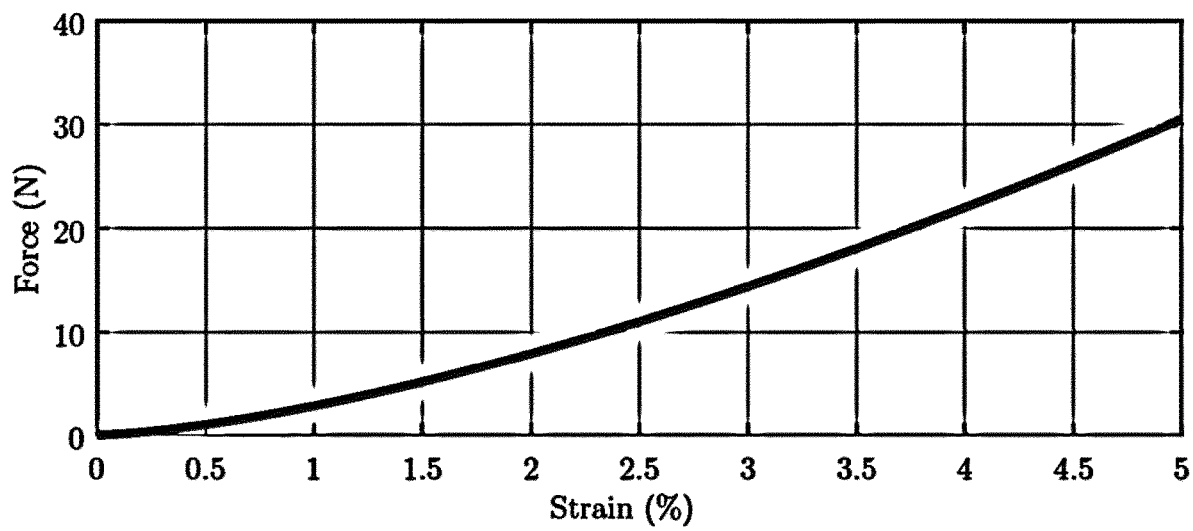
FIG. 4 is a plot of the strain to force relationship of equation 8 for a single MFBG 2 as in FIG. 3.

FIG. 4 is a plot of the strain to force relationship of equation 8 for a single MFBG 2 as in FIG. 3 with a loose magnetic bead 8 on the fiber 6, for a k of 1000 N. A relatively large strain (2.3%) is found from a 10N force. Using equation [3] it can be seen that at 5% the deflection θ is only 17.75°.

Referring back to FIG. 3, as magnetic bead 8 encounters a magnetic field gradient, such as due to an approaching magnet, the magnetic bead 8 is magnetized and then it is attracted with a force 'F.' This induces a tension in the optical fiber shown in Equation [1] and uses the same strain to force relationship of equation [8].

Figure 5:
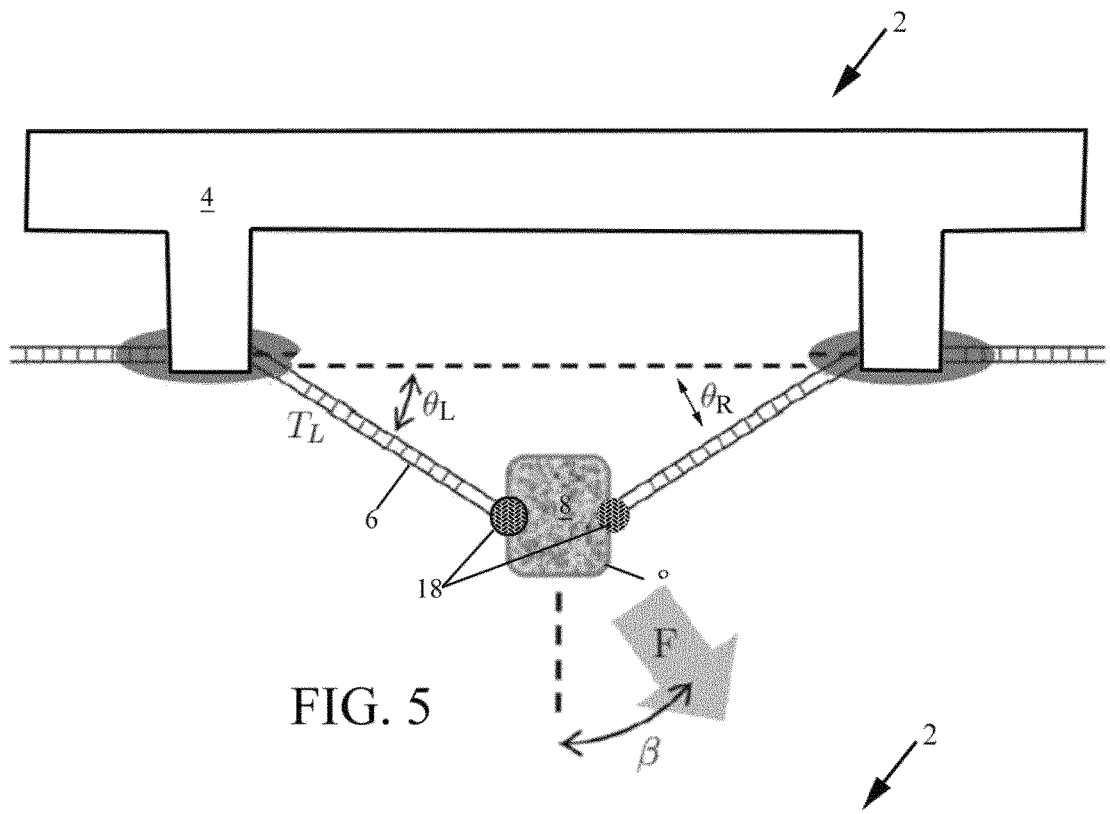
FIG. 5 is a diagrammatic view illustrating the operation of the magnetic bead 8 when it is affixed to the fiber 6.

In an alternate embodiment the magnetic bead(s) 8 may be affixed to the fiber 6 such as, for example, by being glued in place as shown in FIG. 5. In this case, as the magnetic bead 8 encounters a magnetic field gradient it is attracted with a force 'F' that is not necessarily in the plane perpendicular to the fiber 6 axis, creating an angle β between the force and the fiber 6 axis. This induces a tension in the optical fiber 6. As the glue keeps the bead from sliding, it may also imbue a lateral force onto the fiber, essentially breaking the right and left parts of the fiber into two sensors. Now, when finding the force in the device, Fdown is $$F_{down}=T_L*\sin(\theta_L)+T_R*\sin(\theta_R) \quad [9]$$

$$F_{right}=T_L*\cos(\theta_L)+T_R*\cos(\theta_R) \quad [10]$$

$$F=\sqrt{F_{right}^2-F_{down}^2} \quad [11]$$

then it can be seen that $$F = \sqrt{(T_L*\cos(\theta_L) - T_R*\cos(\theta_R))^2 - (T_L*\sin(\theta_L) + T_R*\sin(\theta_L))^2} \quad [12]$$

which simplifies to $$F=\sqrt{T_L^2-T_R^2-2\cos(\theta_L+\theta_R)T_LT_R} \quad [13]$$

Using equations [3] and [6] equation [13] can be restated in terms of strain c of each side $$F = k\sqrt{\varepsilon_L^2 + \varepsilon_R^2 - 2\cos(\cos^{-1}((1+\varepsilon_L)^{-1}) + \cos^{-1}((1+\varepsilon_R)^{-1}))\varepsilon_L\varepsilon_R} \quad [14]$$

and β of the force direction can be solved for as $$\beta = \tan^{-1}\frac{\varepsilon_L*\cos(\cos^{-1}((1+\varepsilon_L)^{-1})) - \varepsilon_R*\cos(\cos^{-1}((1+\varepsilon_R)^{-1}))}{\varepsilon_L*\sin(\cos^{-1}((1+\varepsilon_L)^{-1})) + \varepsilon_R*\sin(\cos^{-1}((1+\varepsilon_R)^{-1}))} \quad [15]$$

which simplifies down to $$\beta = \tan^{-1}\frac{\varepsilon_L*((1+\varepsilon_L)^{-1} - \varepsilon_R(1+\varepsilon_R)^{-1}))}{\varepsilon_L*\sqrt{1-(1+\varepsilon_L)^{-2}} + \varepsilon_R*\sqrt{1-(1+\varepsilon_R)^{-2}}} \quad [16]$$

Figure 6:
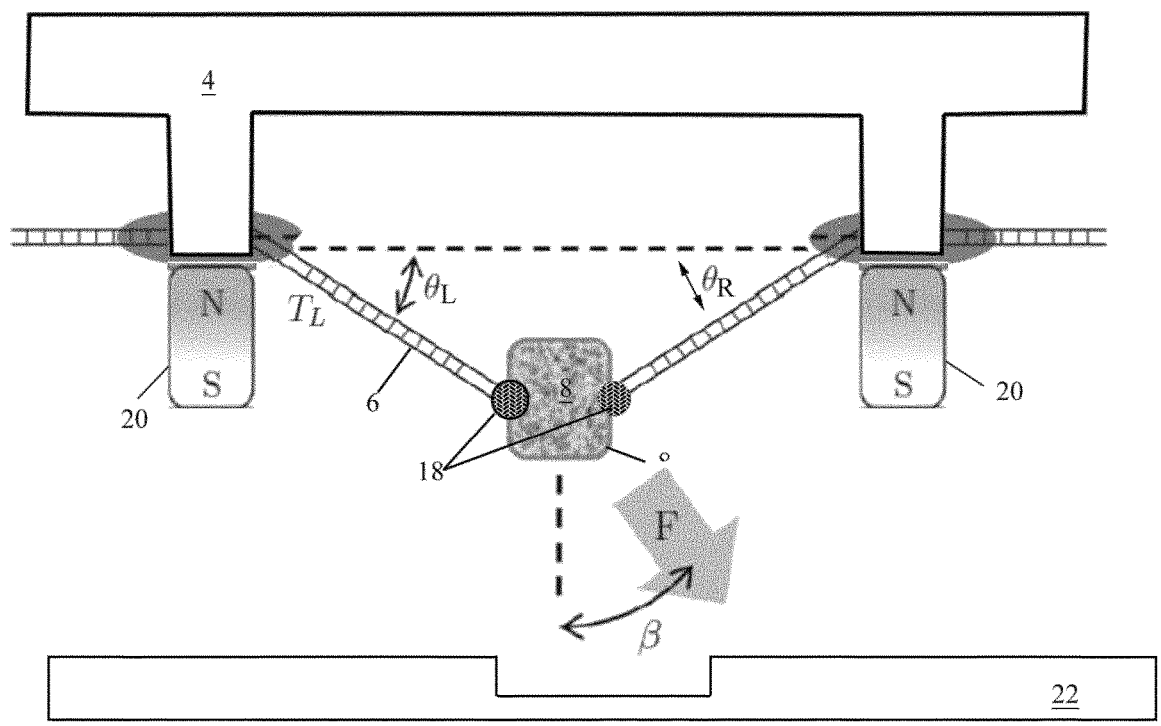
FIG. 6 is a diagrammatic view illustrating the operation of the magnetic bead 8 with a pair of fringing magnets 20 attached to the support structure 4, and an iron bar 22 or other magnetic material placed beneath.

FIG. 6 shows a magnetic bead 8 strung onto and glued at points 18 to the optical fiber 6, and with a pair of fringing magnets 20 attached to the support structure 4, and an iron bar 22 or other magnetic material placed beneath. This embodiment of the MFBG can perform magnetic flux leakage (MFL) testing on the iron bar 22. In this case as magnetic bead 8 encounters a magnetic field gradient, such as due to a void in the magnetic material 22 under the sensor 2 which is magnetized by the two fringing magnets 20 pictured in FIG. 6. This causes a fringing field which attracts the magnetic material 22 with a force 'F.' This may be measured using equation 8 if assumed to be perfectly perpendicular, and equation 14 when the force is non-perpendicular. In another embodiment the iron bar may be a permanent magnet 22.

Figure 7:
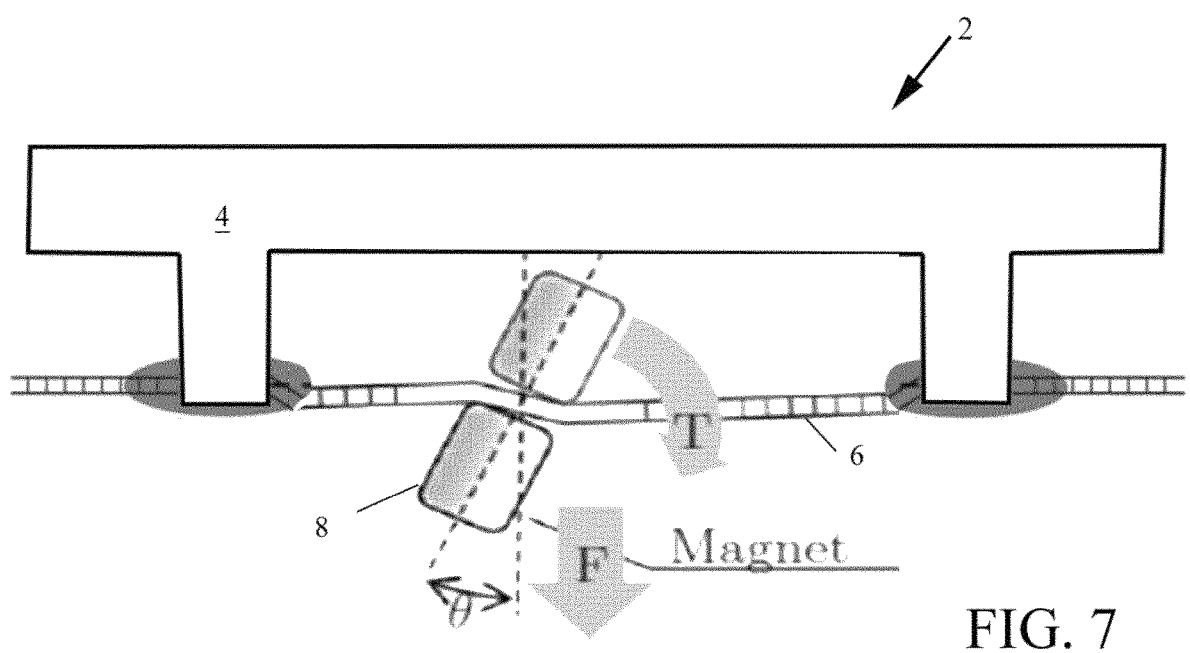
FIG. 7 is a diagrammatic view illustrating the operation of the magnetic bead 8 with twist.

FIG. 7 illustrates how a ferromagnetic member 8 strung on the optical fiber 6 may encounter a magnetic field gradient that causes the magnet 8 to spin to align with the field gradient, as well as attract towards the gradient. This will produce a force 'F' and torque 'T' as indicated. This too induces a tension in the optical fiber 6 which may be measured as above.

Figure 8:
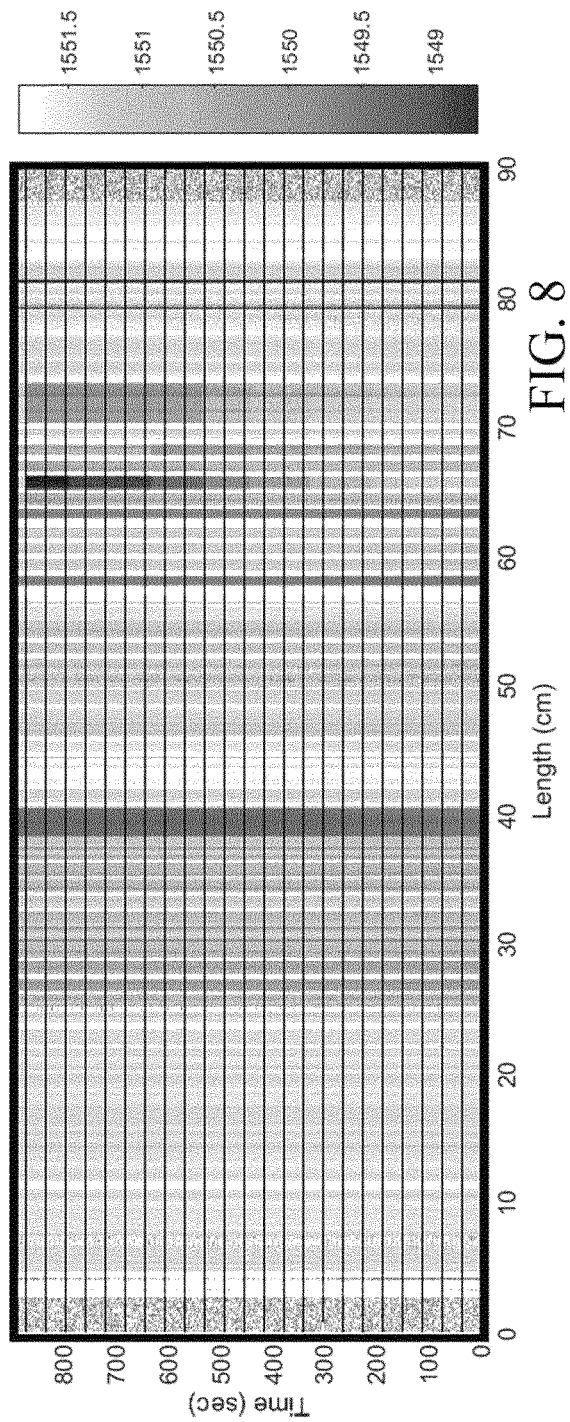
FIG. 8 is a plot of the raw FBG 12 wavelength over time.

FIG. 8 is a plot of the raw FBG 12 wavelength over time, wavelength in nm, along the length of 90 cm with 1.5 mm resolution used to de-multiplex. The x-axis is length along the interrogated fiber 6. The y-axis is time progression of the test. The Bragg imbued region of the fiber optic is 84 cm long. The first 3 cm of the data is free fiber as bay as the last 2.7 cm of the data. The region from 3 cm to 15 cm is loose FBG fiber and may be assumed at a neutral state. There is a pattern of thin regions of lower wavelength data, representing slight compression from gluing the fiber 6 to the structure and also longer tension regions induced between these points. This is due to the glue used to adhere the fiber also compressing, simultaneously mildly straining the fiber between hold points. The region from 58 cm to 70 cm is where the magnets 8 were strung, as shown in FIG. 8. Over time a large test magnet 22 as seen in FIG. 6 was moved progressively closer towards a magnet 8 strung at 67 cm in the data. This attracted the magnet 8, strained the fiber 6 and shifted the Bragg wavelength to a longer λB.

Figure 9:
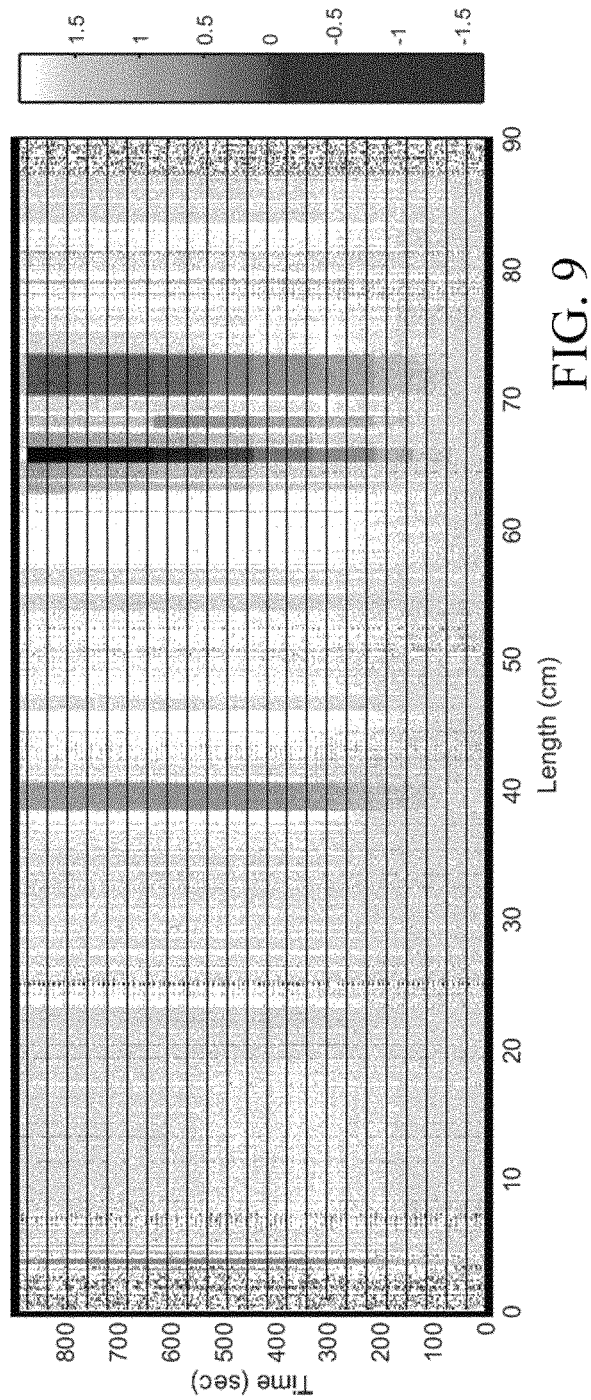
FIG. 9 is a plot of FBG wavelength shift over time.

FIG. 9 is a plot of FBG wavelength shift over time, by subtracting the time 0 sec in FIG. 8 from the rest of the data at each point. The shift in wavelength as the magnetic bar 22 is moved closer to the strung magnet 8 is quite apparent. The tension and stain due to this is clearly isolated from the two non-magnetic fiber sections on either side of the magnet 8. The magnets 8 further over do not respond to the applied magnetic gradient. The data in the first 3 cm and last 2.7 cm of the plot is noise due to the lack of Bragg gratings 12 to reflect back a consistent wavelength, leaving that spectrum to merely be determined by fiber aberrations and quite random. In both FIGS. 8-9 the shade of the patch may be compared to the shade of bar on the right for the wavelength shift in nm.

Figure 10:
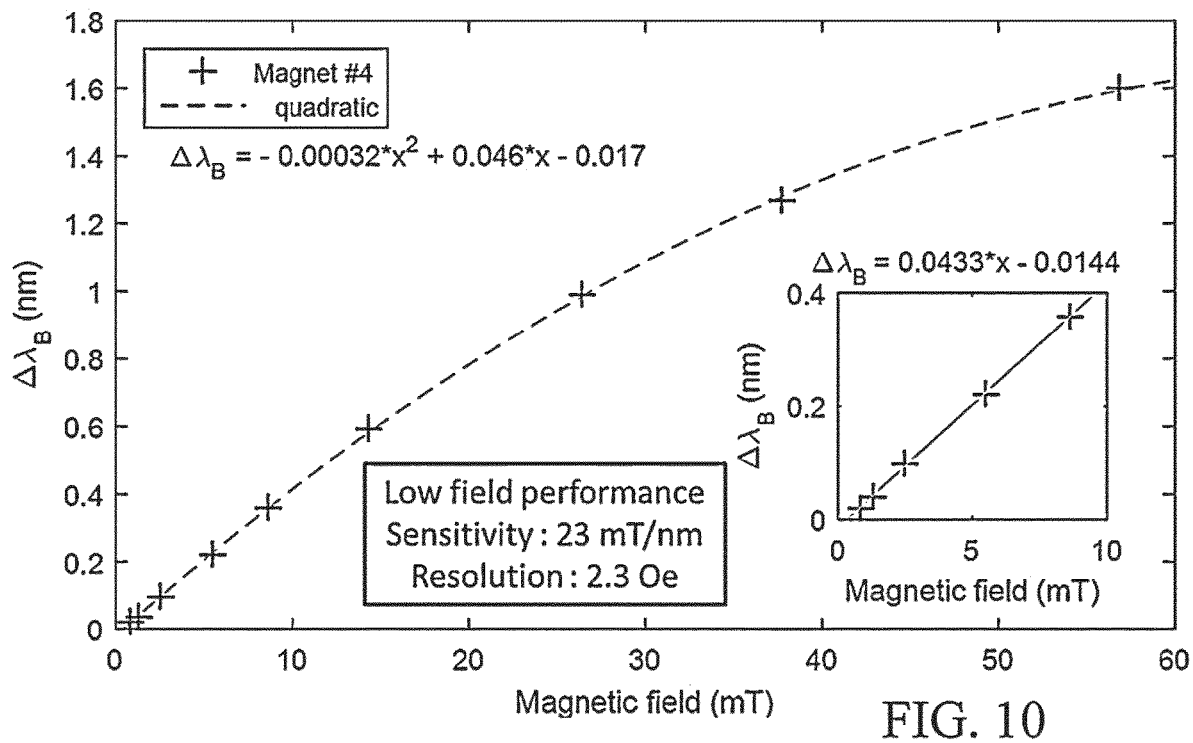
FIG. 10 is a plot of wavelength shift vs. applied field at the point in the fiber 6 where the magnet 8 responded in FIG. 9.

FIG. 10 is a plot of wavelength shift vs. applied field at the point in the fiber 6 where the magnet 8 responded in FIG. 9. The inset is the low field response enlarged. Both have polynomial fits included. The field was found by measuring it at the fiber for that distance between the large magnet 22 and FBG 12. As the fiber-optic system 2 can distinguish shifts down to 10 pm, the device thus has a 2.3 Oe resolution. This is roughly 10× earth's magnetic field (0.3 Oe), and on the order of a Hall Effect sensor resolution. The sensor does not truly respond to magnetic fields, but instead magnetic field gradients.

Figure 11:
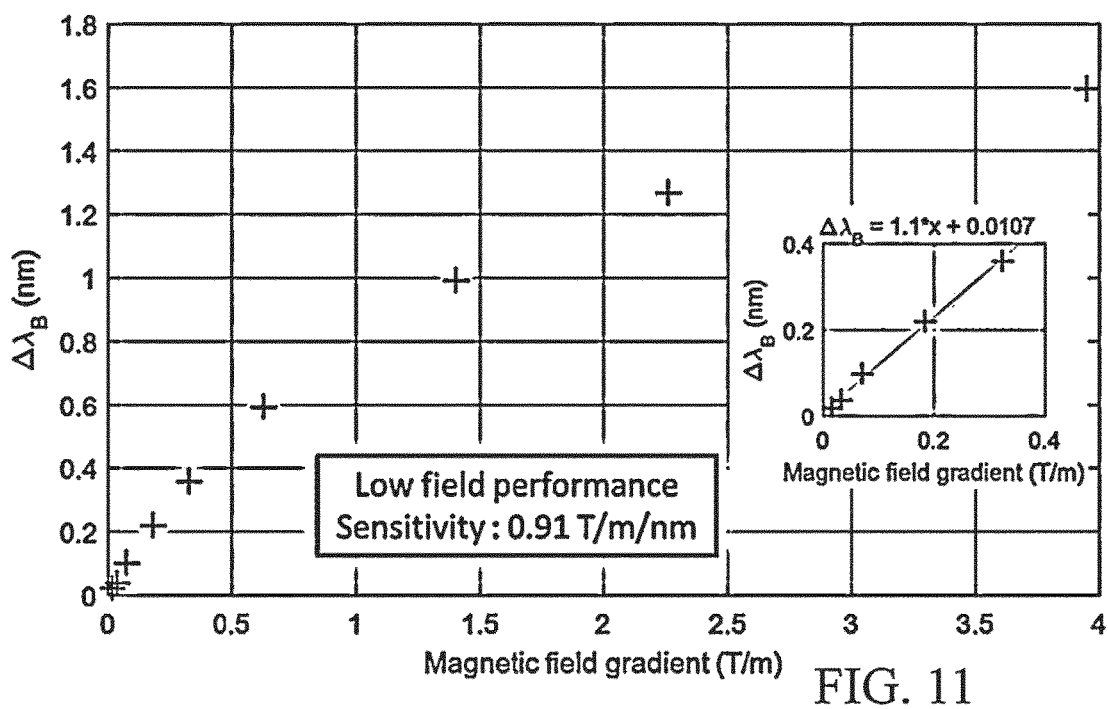
FIG. 11 shows this shift in Bragg wavelength vs. the magnetic field gradient.

FIG. 11 shows this shift in Bragg wavelength vs. the magnetic field gradient. The gradient was found by taking the field measurements used in for FIG. 9.14, finding fitting an equation as a function of distance, and taking a derivate to use as the gradient at each test point. There is a sensitivity in the low gradient measurements of 0.91 T m-1. As the fiber-optic system can distinguish shifts down to 10 pm, the device thus has a 0.0091 T m-1 resolution.

One skilled in the art should understand that the sensitivity is limited by the mechanical stiffness of the optical fiber 6, and by the intensity of the magnetic moment. In this study the fiber 6 'force sensitivity' was 1 nm N-1. A 30 um diameter tapered plastic optical fiber 6 with an FBG 12 has been made with a 'force sensitivity' of 643 nm N-1, and this would proportionally increase the magnetic sensitivity of the sensor 2 to be 643×. Also, increasing the magnetic material of ferromagnetic members 8 and that magnetic materials permeability would proportionally increase the sensitivity. Metglas™ based beads 8 would offer higher permeability than the ferrite toroid cores used herein.

In addition, the magnetic beads 8 may be strung with two fiber optics to offer a multi-dimensional gradient field reading.

Figure 12:
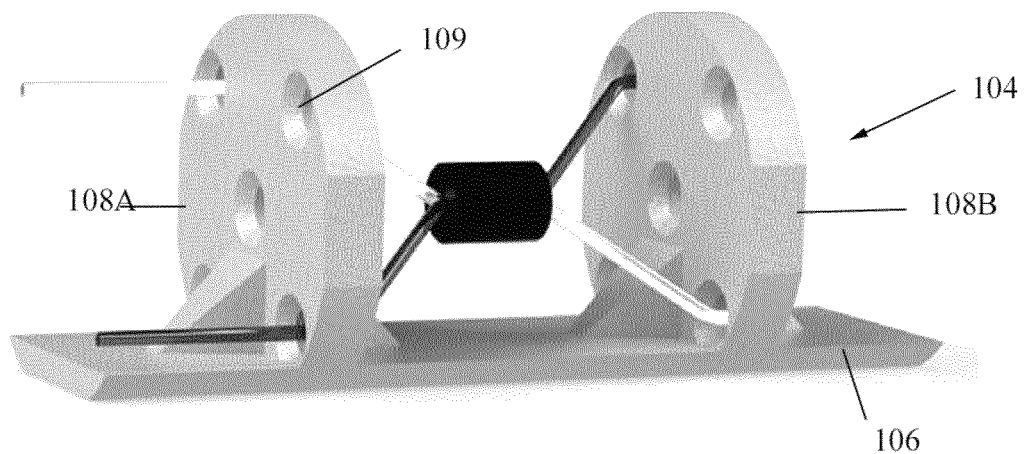
FIG. 12 is a perspective view showing an alternate embodiment of the support structure 104 strung with two fiber optics 6.

FIG. 12 shows an alternate embodiment strung with two fiber optics 6 in which the support structure 104 comprises a flat base 106 underlying and traversing and a pair of raised radial shoulders 108A, 108B that project upward from the underlying base 106. In this embodiment one fiber 6 is strung through one pair of contact points comprising holes 109 in the raised shoulders 108A, 108B, and another fiber 6 is strung through another pair of holes 109. Note that this dual fiber 6 approach also provides directional sensitivity similar to that described with reference to FIG. 6. Two fibers 6 'perpendicular' to each other allow for in-plane vector sensitivity. The force of the magnetic bead 8 in the X-Y plane is captured in the opposed optical fibers 6.

Figure 13:
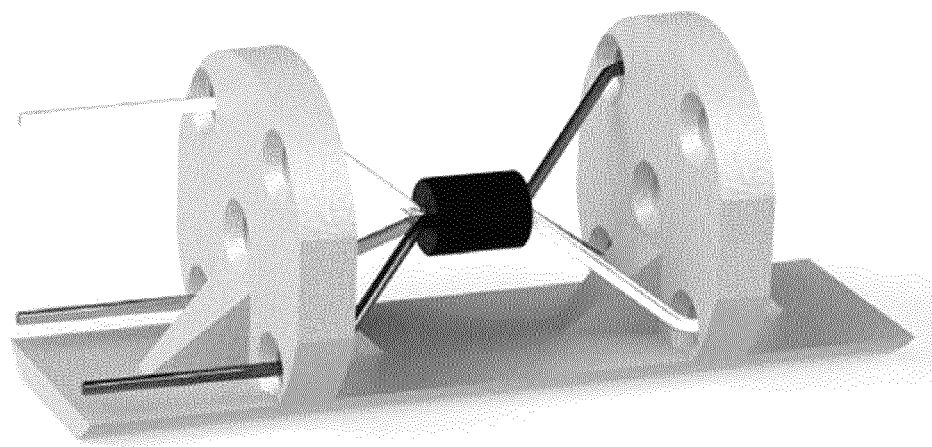
FIG. 13 is a perspective view illustrating the embodiment of FIG. 12 extended to carry three optical fibers 6.

FIG. 13 shows how the embodiment of FIG. 12 can be extended to carry three optical fibers 6. The third fiber 6 added out of plane allows 3D magnetic field sensing. The force of the magnetic bead 8 in the X-Y plane is captured in two of fibers 6, while the third captures the magnetic bead's out of plane force. This methodology allows each fiber 6 to be a separate X, Y, and Z measurement easing a distributed measurements of a largely distributed field gradient. No glue is needed in this embodiment.

It should now be apparent that the above-described invention provides an improved MFBG sensor 2 capable of sensing magnetic gradients, and the fields which create them. The device can be implemented without expensive magneto-optic materials such as Lanthanum Strontium Manganite La0.66Sr0.33MnO3 (LSMO).

Having now fully set forth the preferred embodiment and certain modifications of the concept underlying the present invention, various other embodiments as bay as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

What is claimed:

1. An apparatus for measuring magnetic field gradients, comprising:
    a support structure having a void;
    multiple magnetic members suspended on a cord in the void of said support structure; and
    multiple sensors for detecting multiple strains to said cord induced by said magnetic members when said cord encounters a magnetic field gradient.

2. The apparatus for measuring magnetic field gradients according to claim 1, wherein said cord is an optical fiber and each of said sensors is a fiber Bragg grating (FBG).

3. The apparatus for measuring magnetic field gradients according to claim 1, wherein said void is a bay formed in said support structure.

4. The apparatus for measuring magnetic field gradients according to claim 1, wherein each of said magnetic members is a ferromagnetic bead.

5. The apparatus for measuring magnetic field gradients according to claim 4, wherein said optical fiber is threaded through each of said magnetic beads.

6. The apparatus for measuring magnetic field gradients according to claim 5, wherein each of said ferromagnetic beads is fixedly attached to said optical fiber.

7. The apparatus for measuring magnetic field gradients according to claim 4, wherein each of said ferromagnetic beads is a mass with a cavity that extends through an axis of the mass, such that the cord enters through a first plane of the cavity and exits through a second plane of the cavity.

8. The apparatus for measuring magnetic field gradients according to claim 4, wherein said ferromagnetic beads are permanent magnets.

9. The apparatus for measuring magnetic field gradients according to claim 4, wherein each of said ferromagnetic beads are a rare earth permanent magnet.

10. The apparatus for measuring magnetic field gradients according to claim 1, further comprising a pair of spacers to center the magnetic member on the fiber.

11. The apparatus for measuring magnetic field gradients according to claim 1, wherein said magnetic members are magnetized perpendicular to the optical fiber.

12. The apparatus for measuring magnetic field gradients according to claim 1, further comprising at least one fringing magnet attached to said support structure.

13. The apparatus for measuring magnetic field gradients according to claim 1, further comprising a pair of fringing magnets flanking said magnetic member.

14. The apparatus for measuring magnetic field gradients according to claim 1, wherein said support structure comprises a base and a pair of raised shoulders projecting from said underlying base.

15. An apparatus for measuring magnetic field gradients, comprising:
    a support structure comprising a pair of raised contact points separated by a void;
    an optical fiber having a Fiber Bragg grating (FBG) spaced along the length of said optical fiber, said optical fiber being suspended between the pair of raised contact points with said FBG suspended in said void; and
    multiple ferromagnetic members carried on said optical fiber and suspended in said void; whereby when said magnetic members encounter a magnetic field gradient they induce tension in the optical fiber which alters a refractive index of said FBG.

16. The apparatus for measuring magnetic field gradients according to claim 15, wherein said void is a bay formed in said support structure.

17. The apparatus for measuring magnetic field gradients according to claim 15, wherein said ferromagnetic members are magnetic beads.

18. The apparatus for measuring magnetic field gradients according to claim 17, wherein said optical fiber is threaded through said magnetic beads.

19. The apparatus for measuring magnetic field gradients according to claim 17, wherein said magnetic beads are fixedly attached to said optical fiber.

20. The apparatus for measuring magnetic field gradients according to claim 17, wherein each of said ferromagnetic beads is a mass with a cavity that extends through an axis of the mass, such that the cord enters through a first plane of the cavity and exits through a second plane of the cavity.

21. The apparatus for measuring magnetic field gradients according to claim 17, wherein each of said magnetic beads is a permanent magnet.

22. The apparatus for measuring magnetic field gradients according to claim 15, further comprising a pair of spacers to center the magnetic members on the fiber.

23. The apparatus for measuring magnetic field gradients according to claim 15, wherein said magnetic members are magnetized perpendicular to the optical fiber.

24. The apparatus for measuring magnetic field gradients according to claim 15, further comprising at least one fringing magnet attached to said support structure.

25. The apparatus for measuring magnetic field gradients according to claim 15, wherein said support structure comprises a base and a pair of raised shoulders projecting from said underlying base, and said contact points comprise holes in said raised shoulders for passing said optical fiber.

26. An apparatus for measuring magnetic field gradients, comprising:
a multi-bay support structure comprising a plurality of raised contact points separated from each other by a corresponding plurality of voids;
an optical fiber spaced along the length of said multi-bay support structure and traversing all of said raised contact points and voids, said optical fiber having at least one Fiber Bragg gratings (FBG) spaced along the length of said optical fiber and suspended in said void; and
a plurality of ferromagnetic members all carried on said optical fiber and each suspended in one of said voids.

27. The apparatus for measuring magnetic field gradients according to claim 26, wherein said at least one FBG comprises a single FBG extending across all of said plurality of voids.

28. The apparatus for measuring magnetic field gradients according to claim 26, wherein said at least one FBG comprises a plurality of FBGs each suspended in one of said plurality of voids.

29. The apparatus for measuring magnetic field gradients according to claim 26, wherein said plurality of voids are bays formed in said support structure.

30. The apparatus for measuring magnetic field gradients according to claim 26, wherein said plurality of magnetic members comprises a plurality of magnetic beads and said optical fiber is threaded through all of said plurality of magnetic beads.

31. The apparatus for measuring magnetic field gradients according to claim 26, wherein said plurality of magnetic beads are all fixedly attached to said optical fiber.

32. A method for measuring magnetic field gradients, comprising the steps of:
attaching multiple magnetic members to an optical fiber having a Fiber Bragg grating (FBG) spaced along its length;
suspending said optical fiber on a support structure between a pair of raised contact points so that said FBG and magnetic member are suspended in a void; and
monitoring a refractive index of said FBG;
correlating the monitored refractive index of said FBG to tension in said optical fiber; and
calculating a magnetic field gradient about said optical fiber from the tension in the optical fiber.

\* \* \* \* \*